United States Patent
Singleton et al.

(10) Patent No.: US 8,711,525 B2
(45) Date of Patent: Apr. 29, 2014

(54) MAGNETORESISTIVE SHIELD WITH COUPLED LATERAL MAGNET BIAS

(75) Inventors: Eric W. Singleton, Maple Plain, MN (US); Junjie Quan, Bloomington, MN (US); Shaun E. McKinlay, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 178 days.

(21) Appl. No.: 13/102,714

(22) Filed: May 6, 2011

(65) Prior Publication Data

US 2012/0280773 A1 Nov. 8, 2012

(51) Int. Cl.
*G11B 5/39* (2006.01)

(52) U.S. Cl.
USPC .......................................... 360/319

(58) Field of Classification Search
CPC .................................... G11B 5/3912
USPC .......................................... 360/319
See application file for complete search history.

(56) References Cited

U.S. PATENT DOCUMENTS

| | | |
|---|---|---|
| 5,515,221 A | 5/1996 | Gill et al. |
| 6,597,546 B2 | 7/2003 | Gill |
| 6,710,982 B2 | 3/2004 | Mack et al. |
| 7,236,333 B2 | 6/2007 | Macken |
| 7,606,007 B2 | 10/2009 | Gill |
| 2008/0117552 A1* | 5/2008 | Zhou et al. ............ 360/319 |
| 2008/0253037 A1* | 10/2008 | Kagami et al. ......... 360/324 |
| 2008/0285178 A1* | 11/2008 | Ohta et al. ............. 360/319 |
| 2009/0279213 A1 | 11/2009 | Wu et al. |
| 2012/0250189 A1* | 10/2012 | Degawa et al. ........ 360/319 |

* cited by examiner

*Primary Examiner* — Craig A. Renner
(74) *Attorney, Agent, or Firm* — Hall Estill Attorneys at Law

(57) ABSTRACT

In accordance with various embodiments, at least one magnetic shield for a magnetoresistive (MR) element has one or more lateral hard magnets and a coupling layer contactingly adjacent both the MR element and the hard magnet. The coupling layer concurrently magnetically decouples the MR element while magnetically coupling the hard magnet.

20 Claims, 4 Drawing Sheets

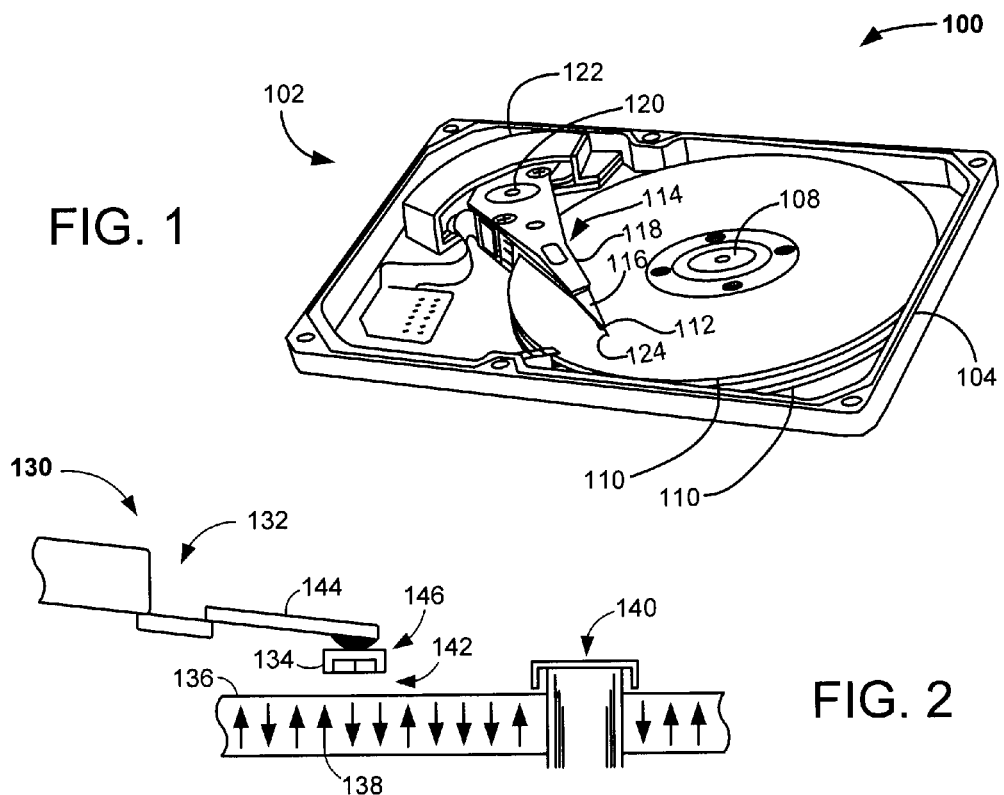
FIG. 1
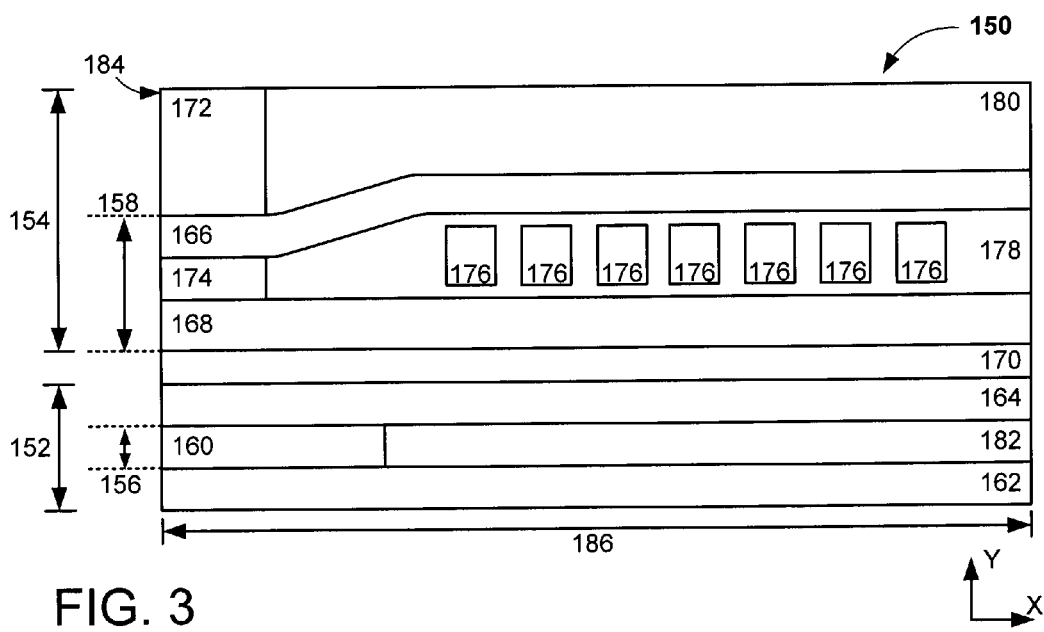
FIG. 2
FIG. 3

MAGNETORESISTIVE SHIELD WITH COUPLED LATERAL MAGNET BIAS

SUMMARY

Various embodiments of the present invention are generally directed to a magnetic shield that may be capable of protecting a magnetoresistive element from unwanted magnetic flux.

In accordance with various embodiments, a magnetic shield for a magnetoresistive (MR) element has one or more lateral hard magnets and a coupling layer contactingly adjacent both the MR element and the hard magnet. The coupling layer concurrently magnetically decouples the MR element while magnetically coupling the hard magnet.

BRIEF DESCRIPTION OF THE DRAWINGS

FIG. 1 generally provides of an embodiment of a data storage device.

FIG. 2 is a perspective view of an embodiment of a portion of a data storage device.

FIG. 3 generally illustrates an example of a magnetic element capable of being used in the portion of the data storage device displayed in FIG. 2.

DETAILED DESCRIPTION

Figure 4:
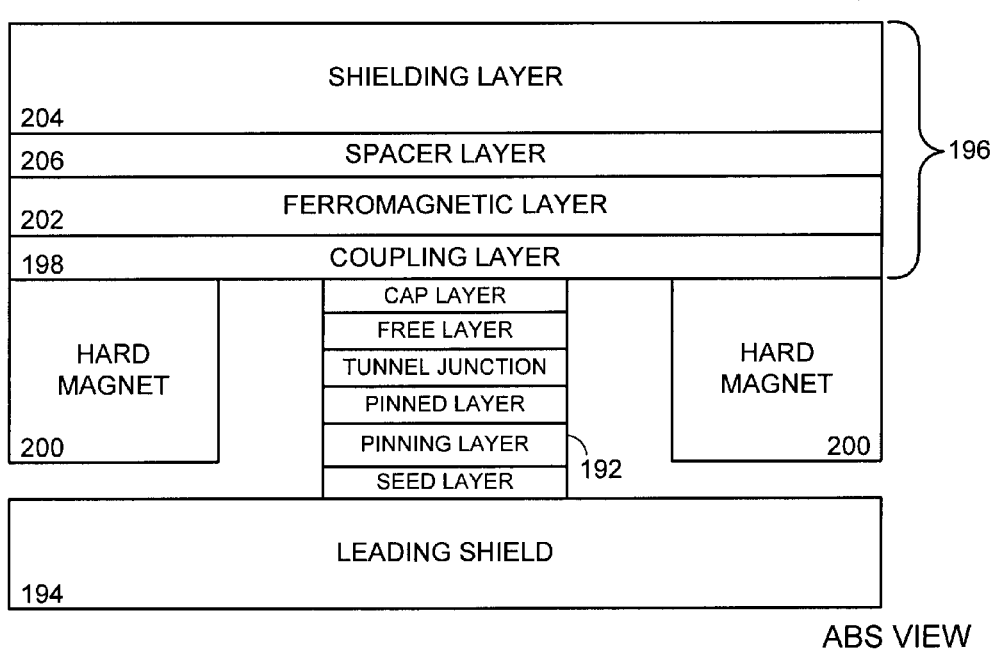
FIG. 4 shows a block representation of an embodiment of a portion of the magnetic element of FIG. 3 as viewed from the air bearing surface (ABS).

The present disclosure generally relates to magnetic shields that may be capable of protecting a magnetoresistive (MR) element from unwanted magnetic flux. As electronics devices become more sophisticated, demand for higher data capacity has placed added emphasis on the size of data written to a data storage media, which can consequently results in a reduction in reader shield to shield spacing. The narrower shield to shield spacing may inadvertently be more acceptable to shield instability due to reduced distance between shield and MR element.

Accordingly, various embodiments of the present invention are generally directed to a magnetic shield for a magnetoresistive (MR) element that has one or more lateral hard magnets and a coupling layer contactingly adjacent to both the MR element and the hard magnet. The coupling layer may concurrently magnetically decouple the MR element while magnetically coupling the hard magnet to allow the lateral hard magnets to pin the magnetization of the shield to a predetermined direction. Such an ability to pin the shield to a particular magnetization can increase shield stability and magnetic noise cancellation while enhancing the accuracy of the MR reader.

An embodiment of a data storage device 100 is provided in FIG. 1. The device 100 shows a non-limiting environment in which various embodiments of the present invention can be practiced. The device 100 includes a substantially sealed housing 102 formed from a base deck 104. An internally disposed spindle motor 108 is configured to rotate a number of magnetic storage media 110. The media 110 are accessed by a corresponding array of data transducers (read/write heads) that are each supported by a head gimbal assembly (HGA) 112.

Each HGA 112 can be supported by a head-stack assembly 114 ("actuator") that includes a flexible suspension 116, which in turn is supported by a rigid actuator arm 118. The actuator 114 may pivot about a cartridge bearing assembly 120 through application of current to a voice coil motor (VCM) 122. In this way, controlled operation of the VCM 122 causes the transducers 124 of the HGA 112 to align with tracks (not shown) defined on the media surfaces to store data thereto or retrieve data therefrom. An ability to decrease the width of the tracks while maintaining proper alignment of the transducers 124 can be accomplished by decreasing the operational width of at least one transducing magnetic element. Thus, the device 100 can have increased capacity through the incorporation of transducing elements with reduced operational width which corresponds to a finer areal resolution.

An example of a data transducing portion 130 of the data storage device 100 of FIG. 1 is displayed in FIG. 2. The transducing portion 130 has an actuating assembly 132 that positions a transducing head 134 over a magnetic storage media 136 that is capable of storing programmed bits 138. The storage media 136 is attached to a spindle motor 140 that rotates during use to produce an air bearing surface (ABS) 142 on which a slider portion 144 of the actuating assembly 132 flies to position a head gimbal assembly (HGA) 146, which includes the transducing head 134, over a predetermined portion of the media 136.

The transducing head 134 can include one or more transducing elements, such as a magnetic writer and magnetically responsive reader, which operate to program and read data from the storage media 136, respectively. In this way, controlled motion of the actuating assembly 132 causes the transducers to align with tracks (not shown) defined on the storage media surfaces to write, read, and rewrite data.

FIG. 3 displays an example of a cross-sectional block representation of a transducing head 150 that is capable of being used in the actuating assembly of FIG. 2. The head 150 can have one or more magnetic elements, such as the magnetic reader 152 and writer 154, which can operate individually, or concurrently, to write data to or retrieve data from an adjacent storage media, such as media 136 of FIG. 2. Each magnetic element 152 and 154 is constructed with multiple magnetic shields and transducing elements that independently define predetermined and separated read and write track 156 and 158.

As displayed, the magnetic reading element 152 has a magnetoresistive reader layer 160 disposed between leading and trailing shields 162 and 164. Meanwhile, the writing element 154 has a write pole 166 and a return pole 168 that create a writing circuit to impart a predetermined magnetic orientation to the adjacent storage media. The return pole 168 is separated from the read element 152 by a gap layer 170 of non-magnetic material while the write pole 166 is disposed between a downtrack shield 172 and an uptrack shield 174 that maintains separation of the write and return poles 166 and 168.

The writing element 154 further includes a coil 176 that can be one or many individual wires capable of imparting a magnetic flux on the write pole 166 to travel through the write circuit that concludes at the return pole 168. Additional insulating layers 178, 180, and 182 respectively surround the coil 176, write pole 166, and MR reader layer 160 to prevent leakage of magnetic flux within the transducing head 150.

The various shields and insulating materials about each magnetic element 152 and 154 provide similar focusing of magnetic fields, but the shields on the ABS 184 are configured to focus magnetic fields within the predetermined tracks 156 and 158. That is, the insulating materials 178 and 180 focus magnetic fields on the write pole 166 while the shields 162, 164, and 172 each prevent the migration of magnetic fields outside the predetermined tracks 156 and 158.

The shields of the transducing head 150 can be characterized by their position with respect to the timing of encountering external bits, such as bits 138 of FIG. 2. In other words, the shields that encounter the external bits before the transducing elements 152 and 154 are "leading" shields while shields that see the bits after the transducing elements are "trailing" shields. Such characterization extends to the difference between "upstream" or "downstream" of the transducing elements in that, depending on the direction of travel for the head 150 and external bits, the shields can be either leading or trailing and either upstream or downstream.

The transducing head 150, and each of the respective layers, has a predetermined thickness measured along a Y plane, and a stripe height 186 measured along an X plane. With respect to the shields 162, 164, and 172, the respective shape and dimensions do not vary along the stripe height 186. As such, each shield maintains a predetermined thickness throughout the extent of each shield's stripe height.

With the track width 158 getting smaller to allow more densely programmed bits on a storage media, more precise definition of the track 158 may correspond with a minimized head 150. The smaller transducing head 150 consequently is more sensitive to unwanted magnetic fields from adjacent tracks. The reduced head 150 topography can further introduce magnetic instability through magnetic domain movement in the magnetic shields due to narrow shield-to-shield spacing. Accordingly, portions of the shields 162 and 164 surrounding the MR element 160 can be configured with magnetic stabilizing features that better focus magnetic flux and more precisely define tracks 156 and 158, as generally illustrated in FIG. 3.

FIG. 4 is a block representation of an embodiment of a portion of a magnetic element 190 displayed as viewed from the ABS. It is to be understood that FIG. 4 is generally illustrated as aligned with a predetermined track where the bottom portion of the element 190 is uptrack and will encounter a magnetic bit before a downtrack portion at the top of the element 190. As a magnetoresistive (MR) reader element 192 encounters a rotating magnetic media, leading and trailing shields 194 and 196 protect the MR element 192 from external magnetic flux. As discussed above, the MR element 192 can be susceptible to unwanted magnetic flux that can induce instability and reduced accuracy, which can be alleviated by stabilizing the magnetic domains of at least the trailing shield 196.

Stabilizing the trailing shield 196 can be achieved by positioning a coupling layer 198 contactingly adjacent to the MR reader element 192, lateral hard magnets 200, and a ferromagnetic layer. The material and orientation of the coupling layer 198 concurrently decouples the MR reader element 192 while coupling to the lateral hard magnets 200 so that the hard magnets 200 bias the ferromagnetic layer 202 of the trailing shield 196 to a predetermined magnetization. The lateral hard magnets 200, therefore, provide a magnetic bias for at least the ferromagnetic layer 202 and a portion of the MR reader element 192, such as the constituent free layer.

The pinning of the ferromagnetic layer 202 by hard magnets 200 with high coercivity stabilizes the trailing shield 196 by reducing magnetic domain movement and reducing noise experienced by the MR element 196 in the presence of magnetic flux. While the introduction of a predetermined magnetization to the trailing shield 196 could effect the MR reader element 192 accuracy, the decoupling of the MR reader element 192 from the ferromagnetic layer 202 by the coupling layer 198 allows the trailing shield 196 to be magnetized without saturating the MR reader element 192 with shield magnetization.

The trailing shield 196 can further be configured with a shielding layer 204 that is separated from the ferromagnetic layer 202 by a non-magnetic spacer layer 206. The shielding layer 204 can be constructed with various materials and orientations to provide a magnetic flux boundary in addition to the ferromagnetic layer 202. As shown, the shielding layer 204 is positioned at the rear-most surface of the shield 196 and while such configuration is not limited, the shielding layer 204 can be constructed to dispel distal unwanted magnetic flux while the ferromagnetic layer 202 dispels unwanted magnetic flux that are proximal to the MR reader element 192.

With the shielding layer 204 and magnetically pinned ferromagnetic layer 202, the trailing shield 196 can protect the MR reader element 198 with enhanced stability due to the combination of passive (without magnetic bias) and active (with magnetic bias) flux blocking. However, the trailing shield 196 is not limited to the configuration shown in FIG. 4 and can be oriented, in various embodiments, with a variety of different materials, layers, and configurations that promote magnetic stability through reduced magnetic domain movement. For example, the trailing shield 196 design can be implemented in the leading shield 194 and other MR element 192 shields.

Figure 5:
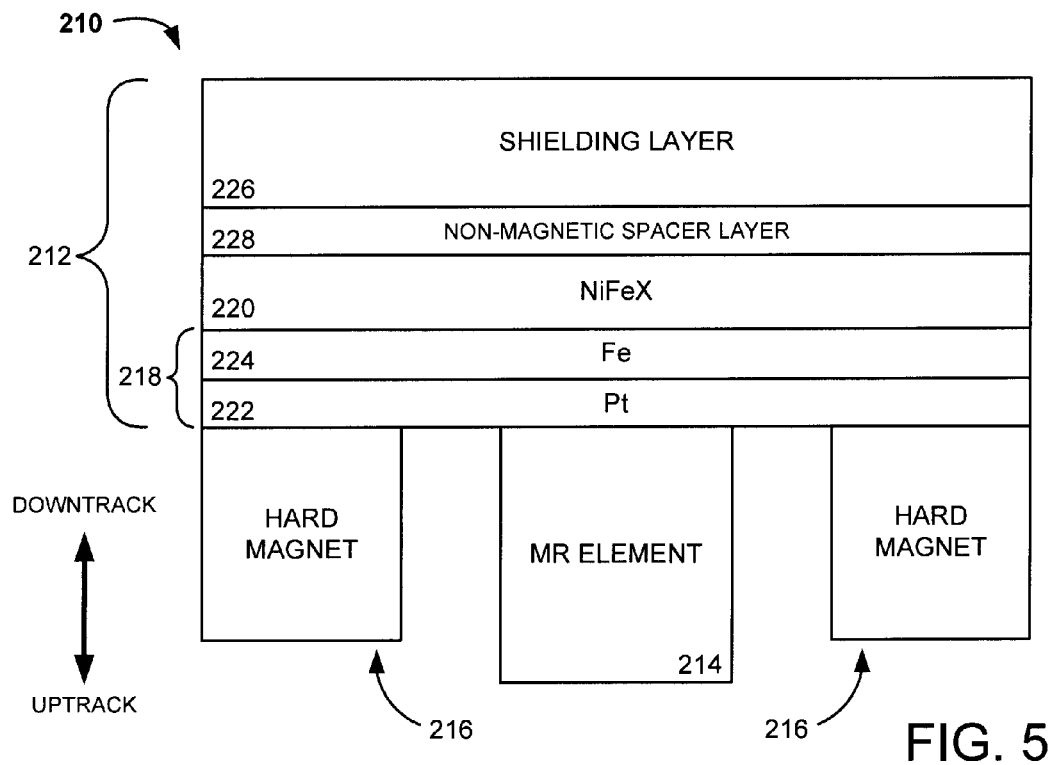
FIG. 5 illustrates a block representation of an embodiment of a shield configuration capable of being used in the magnetic element of FIG. 3.

FIG. 5 displays an embodiment of a portion of a magnetic element 210 that has a trailing shield 212 attached to an MR element 214 that is set to a default magnetization via proximity to lateral hard magnets 216 that can be constructed as either a single material, such as CoPt or FePt, or as a lamination of layers, such as alternating Pt and Fe or Pt and Co, which exhibits high magnetic coercivity. While the lateral hard magnets 216 operate to magnetically bias some or all of the MR element 214, the trailing shield can similarly be set in a predetermined magnetic orientation by the hard magnets 216 through contact with the coupling layer 218.

The magnetic coupling between the hard magnets 216 and the ferromagnetic layer 220 of the trailing shield 212 allows the trailing shield 212 to protect the MR element 214 from unwanted magnetic flux by minimizing magnetic domain migration in the shield 212. Meanwhile, the coupling layer 218 decouples the MR element 214 so that any magnetization of the ferromagnetic layer 220 does not effect the operation of the element 214.

When the lateral hard magnets 216 are constructed with CoPt, FePt, Pt, Co or Fe contacting the coupling layer 218, as shown, the coupling layer 218 can include a non-magnetic layer 222, such as Pt, and a buffer layer 224, such as Fe, that acts to prevent hard magnet 216 layer magnetic property degradation from intermixing with ferromagnetic layer 220. The configuration of the coupling layer 218 and constituent layers 222 and 224 can be configured in various ways to ensure coupling of the hard magnets 216 and decoupling of the MR element 214.

In some embodiments, the thicknesses of the non-magnetic and buffer layers 222 and 224 are adjusted to provide the various operational characteristics of the coupling layer 218. While the thickness, as measured along the plane of the track, of the buffer layer 224 and non-magnetic layer 222 are similar in FIG. 5, such configuration is not required or limited as the buffer layer 224 can be thin to prevent intermixing while allowing the coupling of the hard magnets 216 with the ferromagnetic layer 220 material, such as CoFeX and NiFeX alloy.

The thickness of the non-magnetic layer 222 can also be adjusted to provide a predetermined ratio, the ratio of Pt to Fe for example, in the coupling layer 218 and the hard magnet 216. That is, a hard magnet 216 with a greater percentage of Fe may correspond with a thicker Pt layer 222 so that the construction of the trailing shield 212 has a predetermined Pt/Fe ratio. Regardless of the selected thickness of the Pt layer 222 and Fe layer 224, the continuous contact between the ferromagnetic layer 220 and the coupling layer 218 provides a magnetic connection between the hard magnet 216 and the ferromagnetic layer 220 to actively bias the trailing shield 212 with a predetermined magnetization.

In various non-limiting constructions of the ferromagnetic layer 220, an unlimited number of materials, such as NiFe, NiFeNb, NiFeTa, NiFeRh, NiFeW, CoFe, CoFeB, CoFeZr or CoFeRh, can be used to provide enhanced magnetic stability in the trailing shield 212. The trailing shield 212 can be further constructed, as shown in FIG. 5, with a shielding layer 226 that is separated and decoupled from the ferromagnetic layer 220 by a non-magnetic spacer layer 228.

The presence of active (ferromagnetic layer 220) and passive (shielding layer 226) shielding can contribute to a relatively large trailing shield size. However, the shield-to-shield spacing of the element 210 will not be affected because the ferromagnetic 220 and buffer 224 layers will act as a shield. Hence, the inclusion of the shielding layer 226 provides the trailing shield 212 with both passive and active shielding that can reduce magnetic domain movement while enhancing magnetic stability and shielding unwanted magnetic flux.

Figure 6:
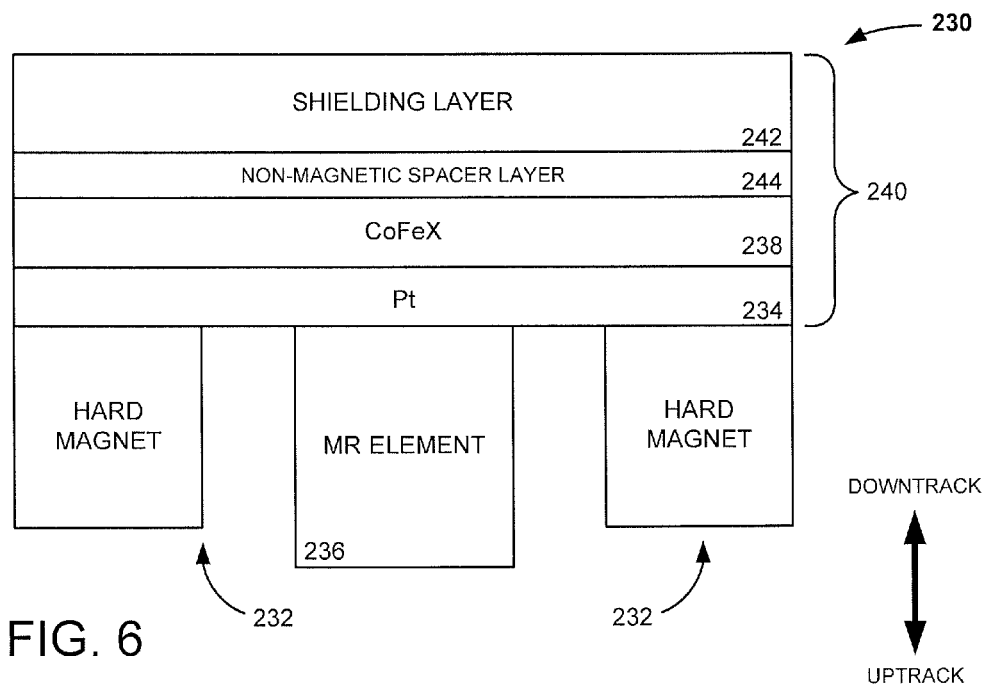
FIG. 6 displays a block representation of an embodiment of a shield configuration capable of being used in the magnetic element of FIG. 3.

An example of a portion of a magnetic element 230 illustrated in FIG. 6 generally presents such a configuration with lateral hard magnets 232 directly attached to the non-magnetic coupling layer 234 without an intervening buffer layer, which differs from the coupling layer 218 of FIG. 5 due to the lack of Ni based material in the ferromagnetic layer 238. The element 230 has an MR element 236 disposed between the two lateral hard magnets 232 and contacting a medial portion of the coupling layer 234. Whether the lateral hard magnets 232 are constructed of a solid Fe-based material or a lamination of Fe and Pt, both the MR element 236 and the ferromagnetic layer 238 can be biased by the hard magnets 232 through contact with the coupling layer 234.

In operation, the continuous Pt coupling layer 234 concurrently decouples the MR element 236 while coupling the lateral hard magnets 232 to the ferromagnetic layer 238. The configuration of the coupling layer 234 and the ferromagnetic layer 238 can each be adjusted to provide a predetermined amount of coupling and magnetic bias to the ferromagnetic layer 238. Of the various adjustments, the ferromagnetic layer 238 can be constructed of a variety of materials, such as CoFe, CoFeB, CoFeZr, and CoFeRh, as well as different orientations not shown in FIG. 6, such as tapered external surfaces.

The various configurations of the element 230 can allow for adjustability of the lateral hard magnets 232 biasing the MR element 236 with a magnetic strength that is different from the bias strength experienced by the ferromagnetic layer 238. As such, the lateral hard magnets serve dual purposes in setting a default magnetization in the MR element 236 while pinning the magnetization of the ferromagnetic layer 238 through the coupling enabled by the coupling layer 234 of Pt.

The magnetization set in the ferromagnetic layer 238 is not limited to a particular strength or direction, but various embodiments configure the thickness, as measured along the track, to be between 10 and 100 nm to pin a magnetization that is strong enough to deflect a wide range of unwanted magnetic flux. It can be appreciated that the bias magnetization provided to the MR element 236 can be easily overcome by a programmed bit, such as bit 138 of FIG. 2, while the bias magnetization for the ferromagnetic layer 238 is stronger to stabilize the magnetization of the trailing shield 240 so that domain movement in the ferromagnetic layer 236 is minimized in the presence of external magnetic flux.

The trailing shield 240 can have an additional magnetic shielding component in the form of a shielding layer 242 that is not biased by the lateral hard magnets 232, as assured by the intervening non-magnetic spacer layer 244, and provides passive magnetic blocking for the MR element 236. The combination of the pinned magnetization of the ferromagnetic layer 238 and the passive shielding layer 242 acts to prevent errant magnetic flux of various strengths and a variety of directions from reaching the MR element 236 or manipulating the magnetization of the trailing shield 240 enough to produce noise that could effect the operation of the MR element 236.

Figure 7:
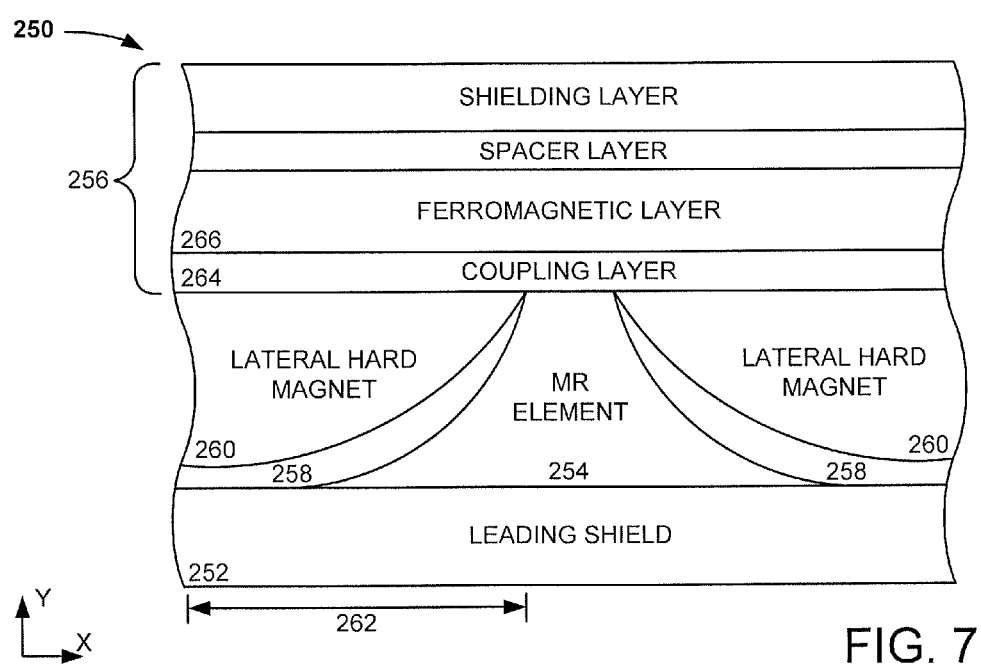
FIG. 7 shows an embodiment of a portion of a shield configuration capable of being used in the magnetic element of FIG. 3.

FIG. 7 generally illustrates a structural view of a portion of a magnetic element 250 as constructed in accordance with various embodiments of the present disclosure. Through one or more non-limiting manufacturing processes, the magnetic element 250 may be constructed with a leading shield 252 on which an MR element 254 is deposited as a single unit or as a lamination of layers of different materials. The MR element 254 has continuously angular sidewalls that decrease the width, as measured along the X plane, of the element 254 from the leading shield 252 to the trailing shield 256.

The MR element 254 is contacted on opposing sides by a non-magnetic barrier layer 258 that ensures only a predetermined amount of magnetic bias reaches the MR element 254 from the lateral hard magnets 260. The barrier layer 258 can be configured, as shown, to be thinner at selected portions of the MR element 254 to allow the hard magnets 260 to effect a stronger bias to certain portions of the MR element 254 (i.e. a magnetic free layer). The curved configuration of the interface of the MR element 254 and lateral hard magnets 260 can create a large contact area 262 between each hard magnet 260 and the coupling layer 264 of the trailing shield 256.

With the large contact area 262, the coupling layer 264 can harness greater magnetization coupling to pin the magnetization of the ferromagnetic layer 266 to a predetermined strength and direction. The large contact area 262 further eases the ability of the coupling layer 264 to decouple the MR element 254 from the magnetization of both the ferromagnetic layer 266 and the lateral hard magnets 260.

Furthermore, all the various layers of the element 250 can be constructed with a variety of materials in multiple orientations that promote magnetic flux blocking and trailing shield 256 stabilization. As discussed above, the lateral hard magnet 260 and coupling layer 264 can each be individual layers or lamination of layers that act in concert to couple the ferromagnetic layer 266 to the hard magnets 260 while decoupling the MR element 254. These various configurations can be selectively manufactured in the element 250 through a predetermined fabrication routine, which is provided in FIG. 8

Figure 8:
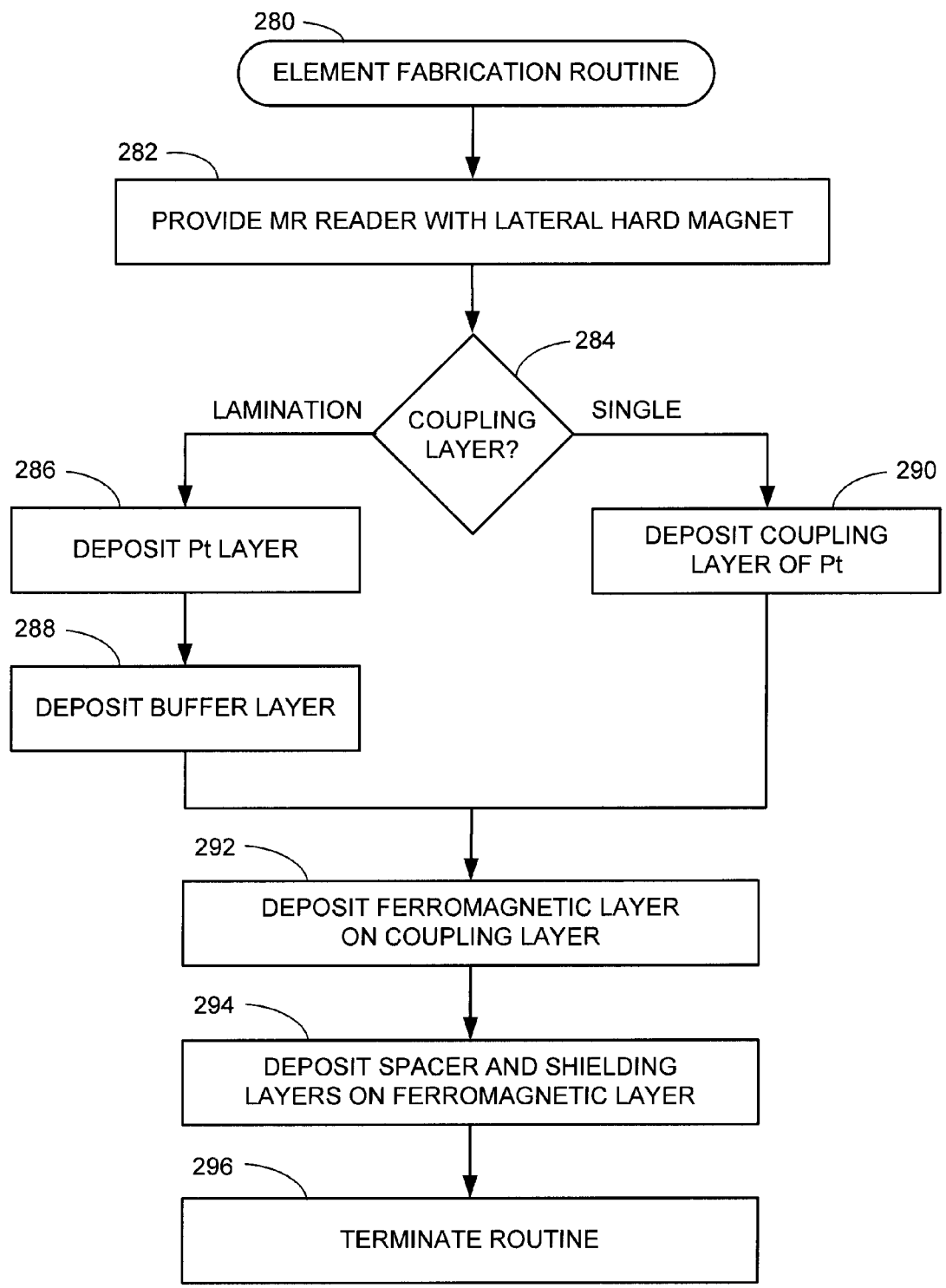
FIG. 8 provides a flowchart mapping an element fabrication routine conducted in accordance with various embodiments of the present invention.

FIG. 8 presents an embodiment of a element fabrication routine 280 conducted in accordance with various embodiments of the present invention. An MR element, such as a magnetically sensitive reader, that is biased by lateral hard magnets is initially provided in step 282 of routine 280. In providing the lateral hard magnets and MR reader in step 282, numerous sub-steps involving the deposition of varying materials as stacked layers may be present. That is, the MR reader and/or the hard magnets may be a lamination of dissimilar materials that may undergo additional processes, such as annealing, that do not appear in the routine 280.

The element in step 282 may also have additional external structure in combination with the MR reader and lateral hard magnets, such as an MR writer and leading magnetic shield, as shown in FIG. 3. Regardless of the external structure, the routine 280 proceeds to decision 284 where the composition of a coupling layer is determined. As discussed above, the coupling layer can correspond to an intervening buffer layer to prevent hard magnet property degradation during manufacturing. Thus, in decision 284, the material of the ferromagnetic layer is evaluated and if Ni is present, the routine 280 advances to step 286.

In step 286, a Pt layer is deposited with a selected thickness in contact with the hard magnets on opposing lateral portions and the MR reader on a medial portion. A buffer layer is subsequently deposited in step 288 onto the Pt layer to prevent hard magnet property degradation. The Pt layer completes the coupling layer lamination that concurrently decouples the MR reader while coupling the lateral hard magnets. However, if Ni is not present at the interface of the coupling layer and ferromagnetic layer, a single layer of Pt is deposited in step 290 onto the MR reader and hard magnets to function as the coupling layer.

With the coupling layer in place, step 292 deposits a ferromagnetic layer on the coupling layer. The ferromagnetic layer can have varying thickness and material composition to create a predetermined active coupling and magnetization through the coupling of the hard magnets to the ferromagnetic layer via the coupling layer. Next, a non-magnetic spacer layer is deposited in step 294 onto the ferromagnetic layer onto which a passive magnetic shielding layer is then attached. The presence of both active and passive shields allows the completed trailing shield to handle a variety of magnetic flux while canceling out magnetic noise.

Through the routine 280, a shielding configuration is determined, installed, and ultimately terminated at step 296. However, the routine is not required or limited as the various decisions and steps can be omitted, changed, and added. For example, the MR reader and hard magnets can be composed of a lamination of different materials, with or without common thicknesses and lateral distances.

It can be appreciated that the configuration and material characteristics of the magnetic shields described in the present disclosure allows for improved magnetic reading through enhancement of the magnetic stability of the trailing shield. The utilization of the lateral hard magnets to actively set a magnetization of the trailing shield may provide improved magnetic shielding of unwanted flux. Moreover, the pinned magnetization of the trailing shield can reduce magnetic domain movement while increasing noise cancellation, thus providing an enhanced environment for the MR element to operate. In addition, while the embodiments have been directed to magnetic sensing, it will be appreciated that the claimed invention can readily be utilized in any number of other applications, including data storage device applications.

It is to be understood that even though numerous characteristics and configurations of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. An apparatus comprising a magnetic shield comprising one or more lateral hard magnets and a coupling layer contactingly adjacent a magnetoresistive (MR) element and each of the lateral hard magnets, the coupling layer comprising a non-magnetic layer and a buffer layer, the non-magnetic layer disposed between each lateral hard magnet and the buffer layer to concurrently magnetically decouple the MR element from the magnetic shield while magnetically coupling each lateral hard magnet to a ferromagnetic layer of the magnetic shield.

2. The apparatus of claim 1, wherein the coupling layer is attached to a medial portion of the MR element and an upper surface of each lateral hard magnet.

3. The apparatus of claim 1, wherein the coupling layer continuously contacts the ferromagnetic layer of the magnetic shield that is set to a predetermined magnetization by the one or more lateral hard magnets.

4. The apparatus of claim 3, wherein each lateral hard magnet biases a ferromagnetic free layer of the MR element and the ferromagnetic layer.

5. The apparatus of claim 3, further comprising a shielding layer of the magnetic shield separated from the ferromagnetic layer by a non-magnetic spacer layer, the non-magnetic spacer layer contacting the ferromagnetic and shielding layers.

6. The apparatus of claim 3, wherein the one or more lateral hard magnets provide a first bias magnetization to the MR element and a second bias magnetization to the ferromagnetic layer.

7. The apparatus of claim 1, wherein the magnetic shield is a trailing shield that is positioned downtrack from the MR element.

8. The apparatus of claim 1, wherein the buffer layer prevents hard magnet magnetic property degradation during manufacturing.

9. The apparatus of claim 1, wherein the non-magnetic layer is Pt and directly contacts the buffer layer and each lateral hard magnet.

10. The apparatus of claim 1, wherein the non-magnetic layer contacts the MR element and each lateral hard magnet while the buffer layer contacts the ferromagnetic layer.

11. The apparatus of claim 1, wherein the non-magnetic layer continuously extends to opposite sides of the MR element.

12. The apparatus of claim 1, wherein each lateral hard magnet has a predetermined first contact area with the coupling layer that is greater than a second contact area between the coupling layer and the MR element.

13. A method comprising providing a magnetic shield for a magnetoresistive (MR) element, the magnetic shield having one or more lateral hard magnets and a coupling layer comprising a non-magnetic layer and a buffer layer, the non-magnetic layer disposed between each lateral hard magnet and the buffer layer, and decoupling the MR element from the magnetic shield with the coupling layer while concurrently coupling each lateral hard magnet to a ferromagnetic layer of the magnetic shield, the coupling layer being contactingly adjacent both the MR element and each lateral hard magnet.

14. The method of claim 13, wherein the coupling layer allows each lateral hard magnet to pin a predetermined magnetization to the ferromagnetic layer that is contactingly adjacent the coupling layer.

15. The method of claim 13, wherein the coupling layer is constructed with the buffer layer in response to the coupling layer having the non-magnetic layer positioned at an interface surface between the coupling layer and each lateral hard magnet.

16. The method of claim 13, wherein each lateral hard magnet provides different bias magnetizations to the MR element and the ferromagnetic layer contacting adjacent the coupling layer.

17. A magnetic element comprising:
 a magnetoresistive (MR) element disposed between lateral hard magnets;
 a coupling layer contactingly adjacent the MR element and the lateral hard magnets, the coupling layer comprising a non-magnetic layer and a buffer layer, the non-magnetic layer disposed between each lateral hard magnet and the buffer layer; and
 a ferromagnetic layer contactingly adjacent the buffer layer, the coupling layer enabling the lateral hard magnets to set a predetermined magnetization in the ferromagnetic layer while magnetically decoupling the MR element from the ferromagnetic layer.

18. The magnetic element of claim 17, wherein the ferromagnetic layer is attached to a non-magnetic spacer, on which a shielding layer is subsequently deposited.

19. The magnetic element of claim 18, wherein the ferromagnetic layer provides active shielding while the shielding layer provides passive magnetic shielding.

20. The magnetic element of claim 17, wherein the buffer layer prevents hard magnet magnetic property degradation in response to Ni material being present at an interface surface between the coupling layer and the ferromagnetic layer.

* * * * *